(12) United States Patent
Yoshizawa

(10) Patent No.: US 6,700,166 B2
(45) Date of Patent: Mar. 2, 2004

(54) SEMICONDUCTOR MEMORY DEVICE WITH IMPROVED SOFT-ERROR RESISTANCE

(75) Inventor: Tomoaki Yoshizawa, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/314,275

(22) Filed: Dec. 9, 2002

(65) Prior Publication Data

US 2003/0222317 A1 Dec. 4, 2003

(30) Foreign Application Priority Data

Jun. 3, 2002 (JP) .................................... 2002-161379

(51) Int. Cl.[7] .................. H01L 29/76; H01L 29/94; H01L 31/062; H01L 31/113; H01L 31/119
(52) U.S. Cl. .................. 257/393; 257/903; 257/904
(58) Field of Search ................ 257/393–394, 257/903–904; 438/152

(56) References Cited

U.S. PATENT DOCUMENTS 5,831,898 A * 11/1998 Ishida et al. ................ 257/904

FOREIGN PATENT DOCUMENTS

| JP | 06-244385 | 9/1994 |
|---|---|---|
| JP | 08-83853 | 3/1996 |
| JP | P2001-36072 A | 2/2001 |

* cited by examiner

Primary Examiner—Cuong Nguyen
(74) Attorney, Agent, or Firm—McDermott, Will & Emery

(57) ABSTRACT

A memory cell has two cross-coupled inverters each formed from a load transistor and a drive transistor. In the memory cell, the gates of the load transistor and the drive transistor are electrically coupled to the same gate line having a poly-metal gate structure. In the memory cell, a potential change at a storage node corresponding to an output node of one inverter is transmitted to the gate of the load transistor of the other inverter through a contact resistance at the interface between a silicon layer and a metal layer of the poly-metal structure.

11 Claims, 6 Drawing Sheets

Y DIRECTION
X DIRECTION

Y DIRECTION
X DIRECTION

SEMICONDUCTOR MEMORY DEVICE WITH IMPROVED SOFT-ERROR RESISTANCE

TITLE OF THE INVENTION

Semiconductor Memory Device with Improved Soft-Error Resistance

BACKGROUND OF THE INVENTION

1. Field of the Invention

The present invention generally relates to a semiconductor memory device. More particularly, the present invention relates to the memory cell structure of a static semiconductor memory device.

2. Description of the Background Art

As a memory cell used in a static random access memory (SRAM) (hereinafter, referred to as "SRAM memory cell"), an SRAM memory cell having a so-called "CMOS (Complementary Metal Oxide Semiconductor) structure" is conventionally known in the art. In the SRAM memory cell having the CMOS structure, a P-type MOS (Metal Oxide Semiconductor) transistor is used as a load transistor and N-type MOS transistors are used as a drive transistor and an access transistor.

FIG. 11 is a circuit diagram showing the structure of the conventional SRAM memory cell having the CMOS structure.

Referring to FIG. 11, conventional SRAM memory cell 100 includes a P-type MOS transistor PT1 and an N-type MOS transistor NT1. P-type MOS transistor PT1 is connected between a power supply node 110 for supplying a power supply potential VDD and a storage node NS. N-type MOS transistor NT1 is connected between a ground node 115 for supplying a ground potential GND and storage node NS. Transistors PT1, NT1 have their gates electrically coupled to a common gate line GL1, and form a single inverter.

SRAM memory cell 100 further includes a P-type MOS transistor PT2 and an N-type MOS transistor NT2. P-type MOS transistor PT2 is connected between power supply node 100 and a storage node /NS. N-type MOS transistor NT2 is connected between storage node /NS and ground node 115. Transistors PT2, NT2 have their gates electrically coupled to a common gate line GL2, and form a single inverter.

Storage node NS is connected to gate line GL2, and storage node /NS is connected to gate line GL1. Such two cross-coupled inverters allow the potentials at storage nodes NS, /NS to be set to complementary levels. In other words, the potential at one of storage nodes NS, /NS is set to one of VDD level (hereinafter, sometimes referred to as "H level") and GND level (hereinafter, sometimes referred to as "L level"), and the potential at the other storage node is set to the other level.

SRAM memory cell 100 further includes N-type MOS transistors AT1, AT2 respectively connected between complementary bit lines BL, /BL and storage nodes NS, /NS. A gate line GLa1 connected to the gate of transistor AT1 and a gate line GLa2 connected to the gate of transistor AT2 are connected to a common word line WL.

In this way, an SRAM memory cell is implemented which uses P-type MOS transistors PT1, PT2 as load transistors, N-type MOS transistors NT1, NT2 as drive transistors, and N-type MOS transistors AT1, AT2 as access transistors. In the SRAM memory cell of FIG. 11, data is written to or read from storage nodes NS, /NS through complementary bit lines BL, /BL during an active (H level) period of word line WL. During an inactive (L level) period of word line WL, data written to storage nodes NS, /NS are stably retained by the two cross-coupled inverters.

Note that, hereinafter, P-type MOS transistors PT1, PT2 are sometimes referred to as load transistors PT1, PT2, N-type MOS transistors NT1, NT2 are sometimes referred to as drive transistors NT1, NT2, and N-type MOS transistors AT1, AT2 are sometimes referred to as access transistors AT1, AT2.

FIG. 12 shows one example of the two-dimensional layout of the SRAM memory cell in FIG. 11. FIG. 12 shows the layout to the level of a first metal wiring layer. The layout of further wiring layers is not shown in FIG. 12.

Referring to FIG. 12, p-type wells 121, 121# and an n-type well 125 are formed at a semiconductor substrate. Drive transistor NT1 and access transistor AT1, which are N-type MOS transistors, are provided on p-type well 121. Load transistors PT1, PT2, which are P-type MOS transistors, are provided on n-type well 125. Access transistor AT2 and drive transistor NT2, which are N-type MOS transistors, are provided on p-type well 121# which is separated from p-type well 121.

More specifically, diffusion layer regions respectively corresponding to drive transistor NT1 and access transistor AT1 are formed at p-type well 121. Diffusion layer regions respectively corresponding to load transistors PT1, PT2 are formed at n-type well 125. Diffusion layer regions corresponding to access transistor AT2 and drive transistor NT2 are formed at p-type well 121#.

Power supply node 110, ground node 115, word lines WL, bit lines BL, /BL and storage nodes NS, /NS are formed in the first metal wiring layer or the like.

Gate lines GL1, GL2, GLa1, GLa2 are formed from a polysilicon layer or the like. In order to implement the connection of FIG. 11, contacts 120 are provided as required between the first metal wiring layer, the diffusion layer regions and a gate line layer.

For example, regarding drive transistor NT1, a source portion of the diffusion layer region corresponding to drive transistor NT1 is electrically coupled to ground node 115 via a contact 120a. A drain portion of the diffusion layer region corresponding to drive transistor NT1 is electrically coupled to storage node NS via a contact 120a. Storage node NS is also electrically coupled to the diffusion layer region corresponding to access transistor AT1 via contact 120a.

Gate lines GLa1, GLa2 respectively corresponding to access transistors AT1, AT2 are electrically coupled via corresponding contacts 120a to word line WL formed in the first metal wiring layer. Gate line GL1 extends so as to be coupled to the gates of drive transistor NT1 and load transistor PT1. In a region above n-type well 125, gate line GL1 is electrically coupled to storage node /NS via a contact 120b. Contact 120b is provided as a contact capable of simultaneously connecting the gate, the diffusion layer and the first metal wiring layer ("shared contact"). Similarly, gate line GL2 extends so as to be coupled to the gates of drive transistor NT2 and load transistor PT2. In a region above n-type well 125, gate line GL2 is electrically coupled to storage node NS via a contact 120b. In general, such gate lines GL1, GL2, GLa1, GLa2 have a silicide structure. In other words, in gate lines GL1, GL2, GLa1, GLa2, a silicide film, a thin metal silicide film (e.g., cobalt silicide), is formed on a polysilicon layer. This enables reduction in resistance of gate lines GL1, GL2, GLa1, GLa2.

However, recent progress of the semiconductor miniaturization technology increasingly reduces the size of the SRAM memory cells. This causes garbled data (inversion of storage data) due to external factors. One of the external factors is a so-called soft error. The soft error is caused by alpha rays that are emitted from a small amount of radioactive substance included in a package. The mechanism of generating a soft error in an SRAM memory cell will now be described with reference to FIG. 11.

Referring back to FIG. 11, it is now assumed that, in the initial state, an L-level potential is stored in storage node NS, an H-level potential is stored in storage node /NS and word line WL is inactive at L level.

If alpha rays are emitted and electrons are excited in the drain portions of the N-type MOS transistors (AT2, NT2) coupled to storage node /NS storing H level, the potential at storage node /NS drops from H level. In such a case, the potential level at storage node /NS would normally restore to H level after a prescribed time because load transistor P2 connected to storage node /NS is ON.

However, if the on-state resistance between the source and the drain of load transistor PT2 is large, the reduced potential at storage node /NS may be propagated through gate line GL1 before restoring to H level. As a result, load transistor PT1 and drive transistor NT1 may be turned ON/OFF in an inverted manner. In other words, load transistor PT1 may be turned ON and drive transistor NT1 may be turned OFF as opposed to the initial data storage state. Such ON/OFF inversion of the transistors inverts the potential at storage node NS from L level to H level, causing erroneous write operation. In order to address such a soft error, it is necessary to reduce the propagation speed of a potential drop at storage node NS or /NS to the gates of drive transistors NT1, NT2 and load transistors PT1, PT2.

For example, one known measure against a soft error is to increase the capacity of the storage nodes. By increasing the capacity of the storage nodes, a potential drop of storage nodes NS, /NS becomes less likely to be caused by electrons generated by alpha rays, thereby preventing data inversion.

However, the capacity of the storage nodes reduces with reduction in memory cell size. On the other hand, if the storage nodes are designed to have an increased capacity in view of a soft error, the cell area is increased and the cell structure becomes more complex. This may cause increased manufacturing costs and reduced yield.

Moreover, reduction in power supply potential VDD facilitates generation of a soft error. Since the operating voltage of the transistors is now increasingly reduced for reduced power consumption, providing measures against a soft error is becoming increasingly important.

SUMMARY OF THE INVENTION

It is an object of the present invention to provide a semiconductor memory device including memory cells with improved soft-error resistance without increasing the area and complicating the structure.

In summary, according to one aspect of the present invention, a semiconductor memory device includes a plurality of memory cells for storing data. Each memory cell includes a first inverter section, a second inverter section, a fifth transistor, a sixth transistor, a first gate line, and a second gate line. The first inverter section includes first and second transistors. The first and second transistors are respectively connected between first and second voltages and a first storage node and have opposite conductivity types. The second inverter section includes third and fourth transistors. The third and fourth transistors are respectively connected between the first and second voltages and a second storage node and have opposite conductivity types. The fifth transistor connects a first signal line to the first storage node. The sixth transistor connects a second signal line complementary to the first signal line to the second storage node. The first gate line has a laminated structure of a first metal layer and a first polysilicon layer, and electrically couple gates of the first and second transistors to the second storage node through a contact resistance between the first metal layer and the first polysilicon layer. The second gate line has a laminated structure of a second metal layer and a second polysilicon layer, and electrically couple gates of the third and fourth transistors to the first storage node through a contact resistance between the second metal layer and the second polysilicon layer.

A main advantage of the present invention is that the poly-metal structure of a word line enables the first and second storage nodes to be electrically coupled to the gates of the first and third transistors Goad transistors) through a contact resistance at the interface between a metal layer and a silicon layer. Accordingly, the propagation speed of a potential drop at the first and second storage nodes caused by external factors such as a soft error to the gates of the first and third transistors (load transistors) can be reduced by merely changing the structure of the gate lines. This enables improvement in soft-error resistance of the memory cell without increasing the memory cell area and complicating the memory cell structure.

According to another aspect of the present invention, a semiconductor memory device includes a plurality of memory cells for storing data. Each memory cell includes a first inverter section, a second inverter section, a fifth transistor, a sixth transistor, a first gate line, and a second gate line. The first inverter section includes first and second transistors. The first and second transistors are respectively connected between first and second voltages and a first storage node and have opposite conductivity types. The second inverter section includes third and fourth transistors. The third and fourth transistors are respectively connected between the first and second voltages and a second storage node and have opposite conductivity types. The fifth transistor connects a first signal line to the first storage node. The sixth transistor connects a second signal line complementary to the first signal line to the second storage node. The first gate line is formed from a first silicon layer and a first metal film formed on the first silicon layer, and is electrically coupled to the second storage node. The first silicon layer is coupled to gates of the first and second transistors. The second gate line is formed from a second silicon layer and a second metal film formed on the second silicon layer, and is electrically coupled to the first storage node. The second silicon layer is coupled to gates of the third and fourth transistors. The first gate line has a non-metal film region, a region where the first metal film is not formed, in a part of a region between the second storage node and the first transistor. The second gate line has a non-metal film region, a region where the second metal film is not formed, in a part of a region between the first storage node and the third transistor.

According to the above semiconductor memory device, a non-silicide region (non-metal film region) provided in a word line having a silicide structure increases the electric resistance between the first and second storage nodes and the gates of the first and third transistors load transistors). Accordingly, the propagation speed of a potential drop at the first and second storage nodes caused by external factors such as a soft error to the gates of the first and third transistors (load transistors) can be reduced by merely adjusting a mask pattern for forming a silicide film (metal film). This enables improvement in soft-error resistance of the memory cell without increasing the memory cell area and complicating the memory cell structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the accompanying drawings.

First Embodiment

Figure 1:
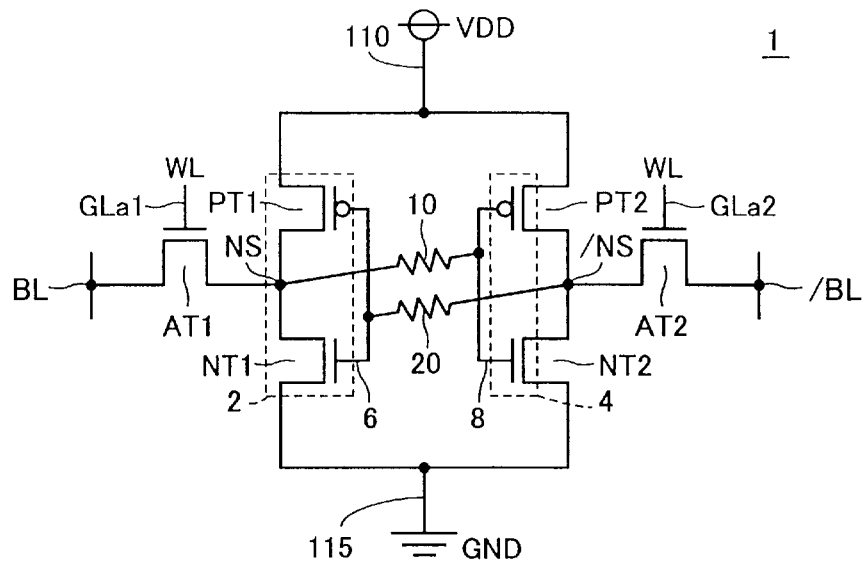
FIG. 1 is a circuit diagram showing the structure of an SRAM memory cell according to a first embodiment of the present invention.

FIG. 1 is a circuit diagram showing the structure of an SRAM memory cell 1 according to a first embodiment of the present invention.

Referring to FIG. 1, SRAM memory cell 1 of the first embodiment has cross-coupled inverters 2, 4 and access transistors AT1, AT2. Each of inverters 2, 4 are connected between a power supply node 110 and a ground node 115.

Inverter 2 is formed from a load transistor PT1 and a drive transistor NT1. Load transistor PT1 is a P-type MOS transistor, and drive transistor NT1 is an N-type MOS transistor. Inverter 2 has its input node connected to a gate line 6 and its output node connected to a storage node NS. Similarly, inverter 4 is formed from a load transistor PT2 and a drive transistor NT2. Load transistor PT2 is a P-type MOS transistor, and drive transistor NT2 is an N-type MOS transistor. Inverter 4 has its input node connected to a gate line 8 and its output node connected to a storage node /NS.

Figure 11:
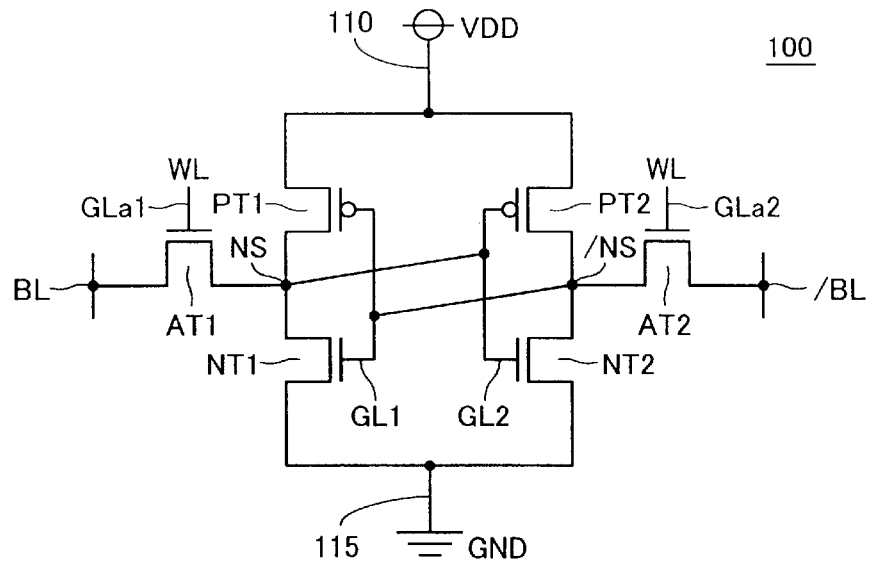
FIG. 11 is a circuit diagram showing the structure of a conventional SRAM memory cell having a CMOS structure.

Data transmission between bit lines BL, /BL and storage nodes NS, /NS is conducted through access transistors AT1, AT2, respectively. Access transistors AT1, AT2 are controlled by a word line WL. The connection of access transistors AT1, AT2, load transistors PT1, PT2 and drive transistors NT1, NT2 is the same as that described in connection with FIG. 11. Therefore, detailed description thereof will not be repeated.

Figure 10:
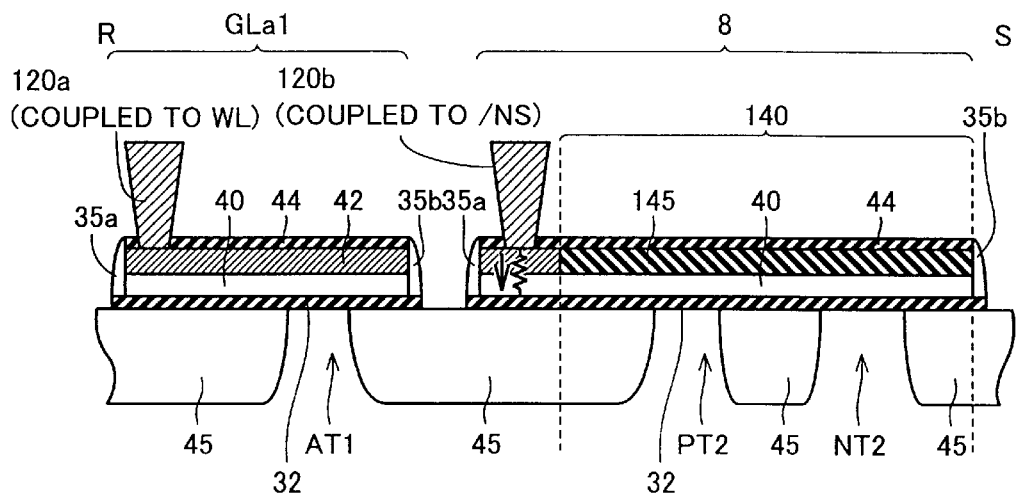
FIG. 10 is a cross-sectional view illustrating the structure of gate lines according to a modification of the third embodiment.

SRAM memory cell 1 is different from conventional SRAM memory cell 100 of FIG. 10 in that SRAM memory cell 1 further includes resistance components 10, 20. Resistance component 10 is provided between storage node NS and gate line 8, and resistance component 20 is provided between gate line 6 and storage node /NS.

Resistance component 10 is provided in order to reduce the propagation speed of a potential drop at storage node NS caused by external factors such as a soft error to the gates of load transistor PT2 and drive transistor NT2 of inverter 4. Similarly, resistance component 20 is provided in order to reduce the propagation speed of a potential drop at storage node /NS to the gates of load transistor PT1 and drive transistor NT1 of inverter 2.

Hereinafter, a method for forming resistance components 10, 20 will be described specifically.

Figure 2:
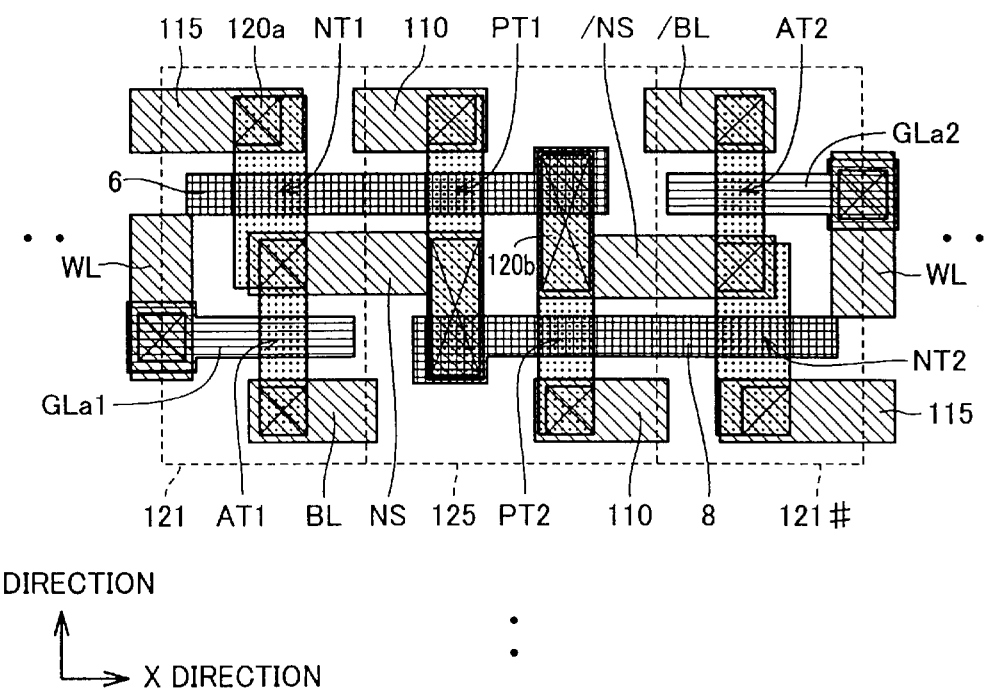
FIG. 2 shows a two-dimensional layout of the SRAM memory cell in FIG. 1.
Figure 12:
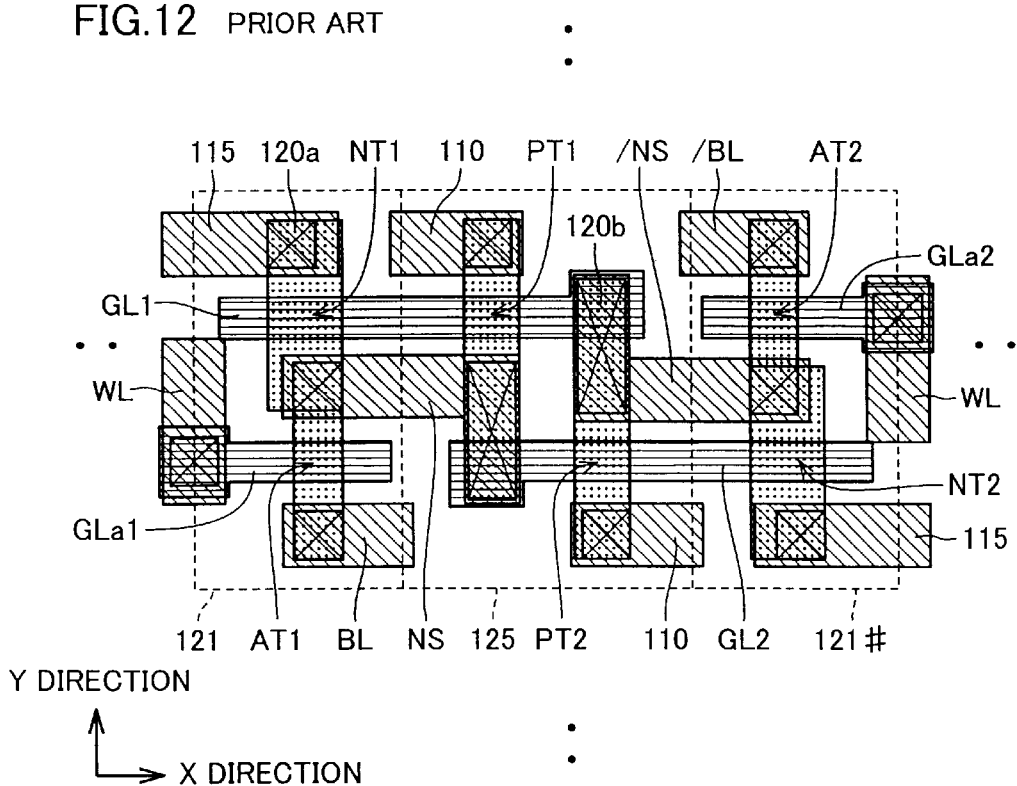
FIG. 12 shows a two-dimensional layout of the SRAM memory cell in FIG. 11.

Referring to FIG. 2, the two-dimensional layout of the SRAM memory cell of the first embodiment is different from that of the conventional SRAM memory cell of FIG. 12 in that gate lines GL1, GL2 are replaced with gate lines 6, 8. Since the two-dimensional layout of the SRAM memory cell of the first embodiment is otherwise the same as that of FIG. 12, detailed description thereof will not be repeated. The memory cell area will not be increased.

In the entire semiconductor memory device, the SRAM memory cells having such a two-dimensional layout are successively arranged in a matrix along the X direction and the Y direction so as to form a memory cell array. In other words, the outer boundary lines of p-type wells 121, 121# and n-type well 125 along the X direction reach the boundary with each adjacent SRAM memory cell in the Y direction, and overlap the outer boundary lines of p-type wells 121, 121# and n-type well 125 of each adjacent SRAM memory cell.

Figure 3:
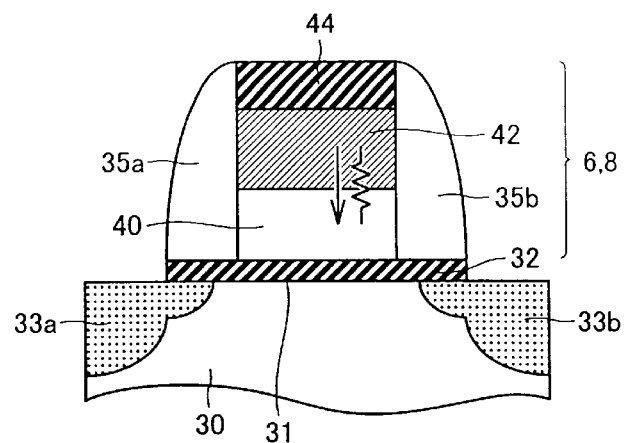
FIG. 3 is a cross-sectional view showing the structure of gate lines in FIG. 2.

FIG. 3 is a cross-sectional view showing the structure of gate lines 6, 8 in FIG. 2.

Referring to FIG. 3, each gate line 6, 8 is formed in a layer located on a gate insulating film 32 on a main surface 31 of a semiconductor substrate 30. As described before, diffusion layer regions 33a, 33b corresponding to a source electrode and a drain electrode of a MOS transistor are formed at an n-type well or a p-type well in semiconductor substrate 30. Gate insulating film 32 is provided as a thin film and insulates a substrate region where a channel is to be formed from the gate line. For example, a silicon oxide film ($SiO_2$) is used as gate insulating film 32.

Each gate line 6, 8 has a laminated structure of a silicon layer 40 and a metal layer 42. Sidewalls (insulating film) 35a, 35b and an insulating film 44 ensure insulation of the laminated structure portion from the surrounding region. Polysilicon is typically used as silicon layer 40. Metal layer 42 may be formed from tungsten (W), copper (Cu), titanium (Ti) or the like. Metal layer 42 is connected to storage node NS or /NS via a contact 120b of FIG. 2.

A gate line having the above structure is commonly referred to as "poly-metal gate". Since a relatively thick metal layer 42 is formed in the gate line, the poly-metal gate has a reduced electric resistance in the wiring direction. However, since different types of materials (metal layer 42 and polysilicon layer 40) contact each other, a relatively large contact resistance is generated at the junction (interface) between metal layer 42 and polysilicon layer 40.

Gate lines 6, 8 thus electrically couple storage nodes NS, /NS to the gates of a corresponding load transistor and a corresponding drive transistor through a contact resistance at the interface between polysilicon layer 40 and metal layer 42. In other words, this contact resistance in each gate line functions as resistance components 10, 20 of FIG. 1. Note that the poly-metal gate is disclosed in detail in, e.g., Japanese Laid-Open Publication No. 2001-36072.

As a result, a potential change at storage nodes NS, /NS each coupled to a corresponding metal layer 42 is transmitted to the gates of load transistors PT1, PT2 and drive transistors NT1, NT2 through a corresponding contact resistance, respectively. This enables reduction in propagation speed and thus improves soft-error resistance of the SRAM memory cell.

As has been described above, according to the first embodiment, the gate lines have a poly-metal gate structure. This enables an SRAM memory cell with improved soft-error resistance to be implemented without increasing the memory cell area and complicating the memory cell structure.

Second Embodiment

In the second embodiment, another example of the structure of a gate line in the SRAM memory cell of the first embodiment will be described.

Figure 4:
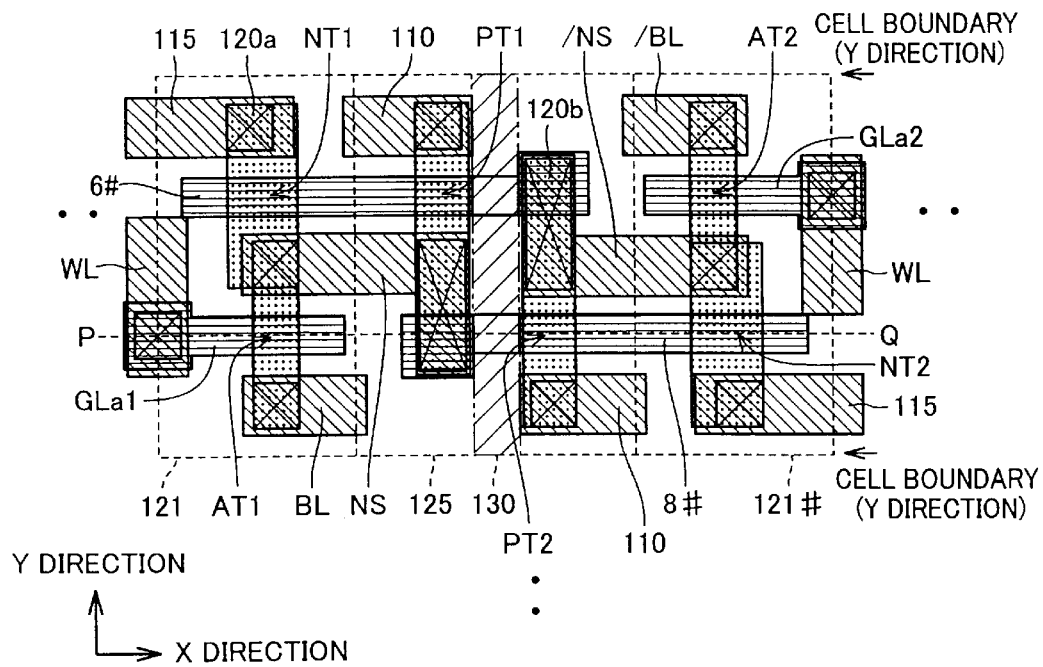
FIG. 4 shows a two-dimensional layout of an SRAM memory cell according to a second embodiment of the present invention.

Referring to FIG. 4, the two-dimensional layout of the second embodiment is different from that of FIG. 2 in that gate lines 6, 8 are replaced with gate lines 6#, 8#. Since the two-dimensional layout of FIG. 4 is otherwise the same as that of FIG. 2, detailed description thereof will not be repeated.

Like the gate lines in the conventional SRAM memory cell described above, each gate line 6#, 8# has a silicide structure. In other words, each gate line 6#, 8# is formed from a silicon layer (polysilicon layer) and a metal silicide film formed on the polysilicon layer. Such a silicide structure allows gate lines 6#, 8# to have a reduced electric resistance in the wiring direction.

Gate lines 6#, 8#, GLa1, GLa2 extend in the same direction. A diffusion layer region of each transistor extends in a direction along the boundary between the p-type well and the n-type well.

Moreover, in gate lines 6#, 8#, a non-silicide region 130 extends in a direction along the boundary between p-type well 121, 121# and n-type well 125 (i.e., in the Y direction). Non-silicide region 130 is formed at a position between storage nodes NS, /NS and the gates of load transistors PT1, PT2 and the gates of drive transistors NT1, NT2. In non-silicide region 130, no silicide film is formed on the polysilicon layer in each gate line 6#, 8#.

Non-silicide region 130 is formed between diffusion layer regions respectively corresponding to load transistors PT1, PT2, and reaches the boundary between p-type well 121, 121# and n-type well 125 along the X direction, that is, the boundary region with each adjacent memory cell in the Y direction.

Such a non-silicide region 130 can be formed by adjusting mask pattern features in the step of forming a silicide film 42# described below. In particular, if non-silicide region 130 has a simple rectangular shape as shown in FIG. 4, a mask having a simple repeated pattern can be used. This enables such an SRAM cell to be manufactured without complicating the manufacturing process.

Figure 5:
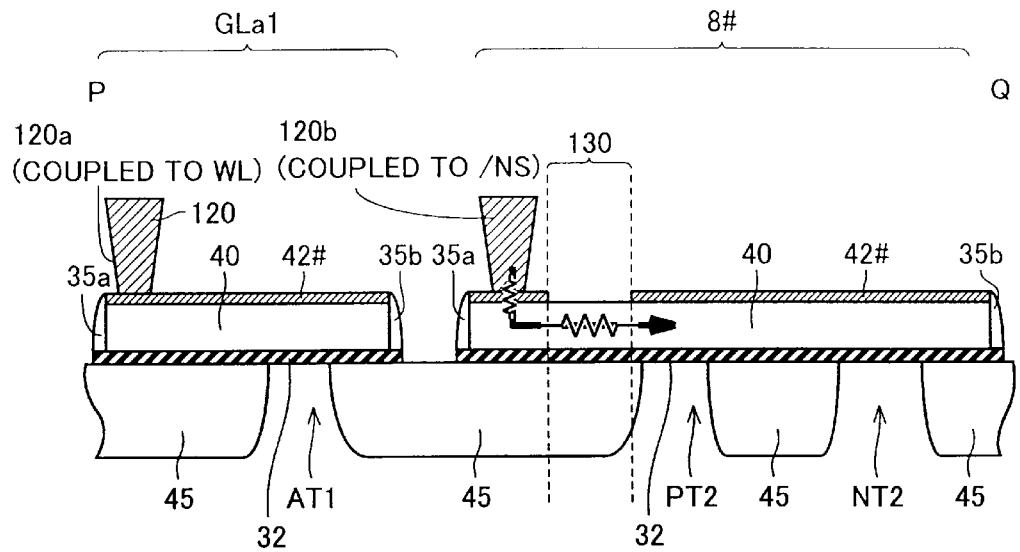
FIG. 5 is a cross-sectional view showing the structure of gate lines in FIG. 4.

FIG. 5 is a cross-sectional view showing the structure of gate lines 6#, 8# in FIG. 4. FIG. 5 is a cross-sectional view taken along line P-Q in FIG. 4.

Referring to FIG. 5, each gate line GLa1, 8# is formed from a silicon layer (polysilicon layer) 40 and a metal film (silicide film) 42# formed on polysilicon layer 40 in the same manner as that described in connection with FIG. 12. Polysilicon layer 40 and silicide film 42# are formed on a gate insulating film 32, and polysilicon layer 40 is insulated from the surrounding region by sidewalls 35a, 35b. Silicide film 42# is electrically coupled to another wiring, node and the like via a corresponding contact 120a, 120b. Access transistor AT1, load transistor PT2, drive transistor NT2 are electrically insulated from each other by an insulating layer 45.

Gate line 8# having such a silicide structure has a part of non-silicide region 130 having no metal film (silicide film) 42#. Non-silicide region 130 is provided between a region electrically coupled to storage node NS via contact 120b and a region right above the gates of load transistor PT2 and drive transistor NT2.

In other words, in non-silicide region 130, an electric signal transmitted via contact 120b is propagated only through polysilicon layer 40. This increases an electric resistance in this portion. As a result, the contact resistance between silicide layer 42# and polysilicon layer 40 is smaller than that between metal layer 42 and polysilicon layer 40 in the poly-metal gate of FIG. 3, but resistance component 10 of FIG. 1 can be formed by non-silicide region 130. Although not shown in the figure, in gate line 6# having the silicide structure, non-silicide region 130 is provided in the same manner as that of gate line #8.

Like the first embodiment, the second embodiment also enables reduction in propagation speed of a potential change at storage nodes NS, /NS to the gates of load transistors PT1, PT2 and drive transistors NT1, NT2. As a result, an SRAM memory cell with improved soft-error resistance can be implemented without increasing the memory cell area and complicating the memory cell structure.

Modification of Second Embodiment

In the modification of the second embodiment, a variation of the structure of the SRAM memory cell using a gate line having a silicide structure will be described.

Figure 6:
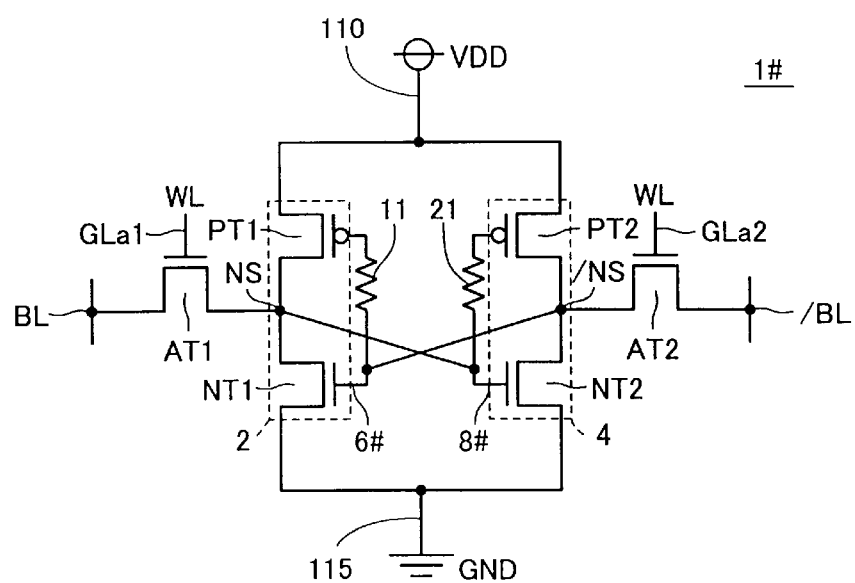
FIG. 6 is a circuit diagram showing the structure of an SRAM memory cell according to a modification of the second embodiment.

FIG. 6 is a circuit diagram showing the structure of an SRAM memory cell 1# according to the modification of the second embodiment.

Referring to FIG. 6, SRAM memory cell 1# of the modification of the second embodiment is different from SRAM memory cell 1 of the first embodiment in FIG. 1 in that resistance components 10, 20 are replaced with resistance components 11, 21. Each resistance component 11, 21 is formed between the gates of a load transistor and a drive transistor of a corresponding inverter, rather than between storage node NS, /NS and the gates of transistors.

As described in the background art, a soft error is generated because load transistor PT1 or PT2 is erroneously turned ON in response to a potential drop at storage node NS or /NS. Accordingly, soft-error resistance can be similarly improved even if resistance components 10, 20 of FIG. 1 are replaced with resistance components 11, 21 which are respectively provided between load transistor PT1 and drive transistor NT1 and between load transistor PT2 and drive transistor NT2. In other words, soft-error resistance can be improved even if resistance components are present between storage nodes NS, /NS and the gates of load transistors PT1, PT2, respectively.

Even if drive transistors NT1, NT2 are turned OFF in response to a potential drop at storage nodes NS, /NS, storage nodes NS, /NS are merely rendered in an electrically floating state (high impedance state). Therefore, unless load transistors PT1, PT2 are erroneously turned ON, the initial data storage state can be retained as a result of restoration of the reduced potential level at the storage nodes.

Since the circuit structure of the SRAM memory cell of the modification of the second embodiment is otherwise the same as that of the first embodiment, detailed description thereof will not be repeated.

Figure 7:
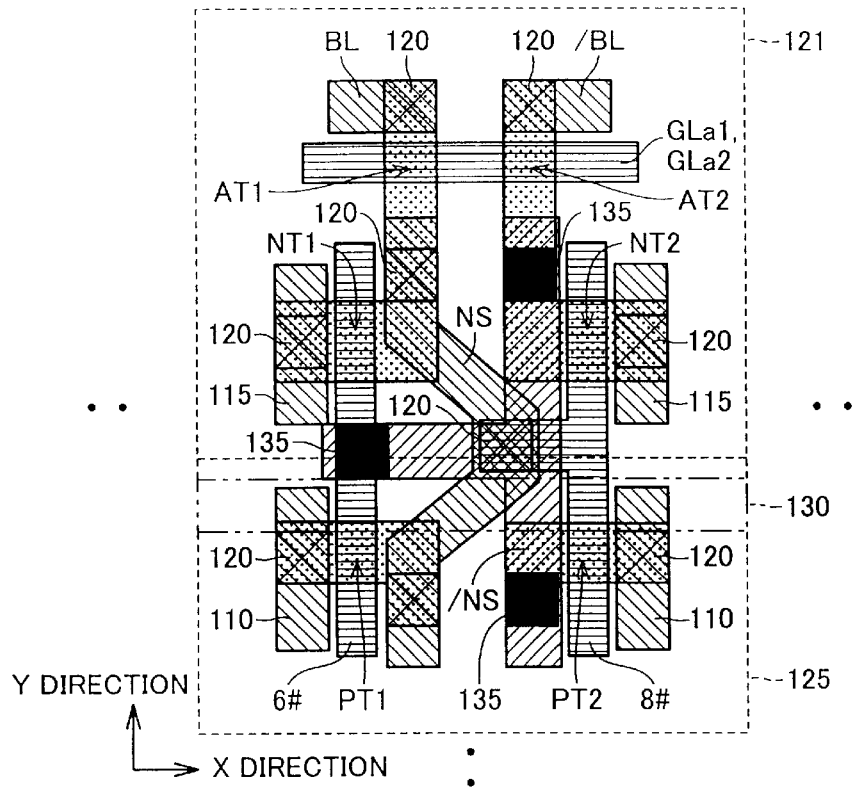
FIG. 7 shows a two-dimensional layout of the SRAM memory cell in FIG. 6.

FIG. 7 shows a two-dimensional layout of the SRAM memory cell in FIG. 6. In FIG. 7, SRAM memory cell 1# of FIG. 6 is provided according to the layout of a so-called "longitudinal cell".

Referring to FIG. 7, drive transistors NT1, NT2 and access transistors AT1, AT2 (all of which are N-type MOS transistors) are formed on a p-type well 121. Load transistors PT1, PT2 (P-channel MOS transistors) are formed on an n-type well 125. In other words, diffusion layer regions for forming these transistors are provided in p-type well 121 and n-type well 125. The diffusion layer regions corresponding to drive transistors NT1, NT2 and load transistors PT1, PT2 extend in the direction along the boundary between p-type well 121 and n-type well 125, that is, in the X direction. On the other hand, the diffusion layer regions corresponding to access transistors AT1, AT2 extend in the direction that crosses the X direction, that is, in the Y direction.

In order to implement the connection of FIG. 6, contacts 120 and through holes 135 are provided as appropriate between the first metal wiring layer, the diffusion layer regions and a gate line layer.

In the entire semiconductor memory device, the SRAM memory cells having the two-dimensional layout of FIG. 7 are successively arranged in a matrix along the X direction and the Y direction so as to form a memory cell array. In other words, the outer boundary lines of p-type well 121 and n-type well 125 reach the boundary with each adjacent SRAM memory cell in the X direction and the Y direction, and overlap the outer boundary lines of p-type well 121 and n-type well 125 of each adjacent SRAM memory cell.

As in the case of FIG. 2, storage nodes NS, /NS, power supply node 110, ground node 115 and bit lines BL, /BL are formed in a first metal wiring layer. Gate lines GLa1, GLa2 corresponding to access transistors AT1, AT2 are provided as an integral gate line. Although not shown in the figure, gate lines GLa1, GLa2 are electrically coupled to word line WL via a contact. Gate lines 6#, 8# have a silicide structure as in the case of the second embodiment, and extend in the Y direction.

Gate lines 6#, 8# have the same structure as that of FIG. 5. In other words, each gate line 6#, 8# is formed from a polysilicon layer 40 and a silicide film 42# formed on polysilicon layer 40. Moreover, a non-silicide region 130 having no silicide film 42# is provided between a region right above the gates of load transistors PT1, PT2 and a contact region with storage nodes NS, /NS. Non-silicide region 130 extends in the X direction between the diffusion layer regions corresponding to load transistors PT1, PT2. In other words, non-silicide region 130 reaches the boundary region with each adjacent SRAM memory cell in the Y direction.

Resistance components 11, 21 of FIG. 6 can thus be formed by gate lines 6#, 8# having a silicide structure having a non-silicide region. As in the two-dimensional layout of FIG. 4, non-silicide region 130 has a simple rectangular shape. Therefore, non-silicide region 130 can be formed by using a mask having a simple repeated pattern.

Accordingly, like the second embodiment, an SRAM memory cell with improved soft-error resistance can be implemented without increasing the memory cell area and complicating the memory cell structure.

Third Embodiment

In the third embodiment, another example of the structure of the gate line having the poly-metal gate structure as described in the first embodiment will be described.

Figure 8:
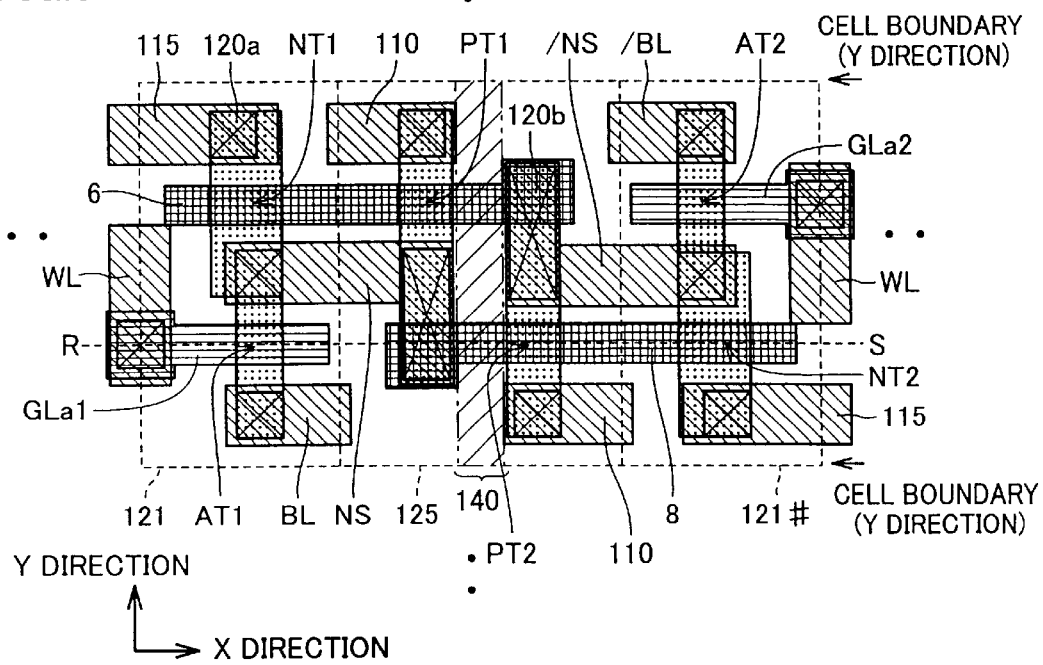
FIG. 8 shows a two-dimensional layout of an SRAM memory cell according to a third embodiment of the present invention.

The two-dimensional layout of the third embodiment in FIG. 8 is different from that of the first embodiment in FIG. 2 in that gate lines 6, 8 has a metal-layer removal region 140. Metal-layer removal region 140 is a region where no metal layer (in the present embodiment, metal layer 42) is removed. In other words, no metal layer is formed in metal-layer removed region 140. In gate line 6, metal-layer removal region 140 is formed between a contact region coupled to storage node /NS and the gates of drive transistor NT1 and load transistor PT1. In gate line 8, metal-layer removal region 140 is formed between a contact region coupled to storage node NS and the gates of drive transistor NT2 and load transistor PT2.

As described in the modification of the second embodiment, metal-layer removal region 140 must be provided at least between storage nodes NS, /NS and regions right above the gates of load transistors PT1, PT2.

Hereinafter, the structure of the gate line of the third embodiment will be described.

Figure 9:
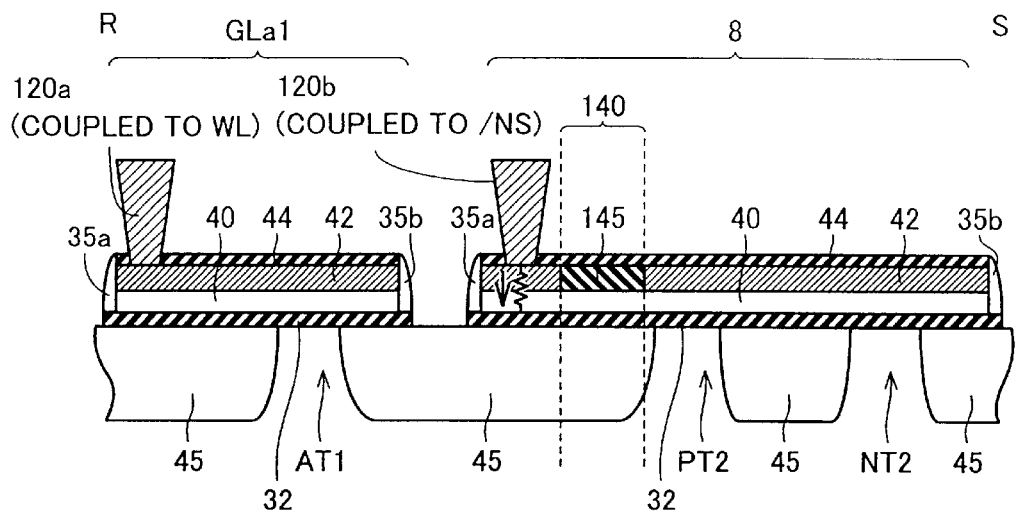
FIG. 9 is a cross-sectional view illustrating the structure of gate lines according to the third embodiment.

FIG. 9 is a cross-sectional view illustrating the structure of the gate line according to the third embodiment. FIG. 9 is a cross-sectional view taken along line R–S in FIG. 8.

Referring to FIG. 9, each gate line GLa1, 8 has a poly-metal gate structure. In other words, each gate line GLa1, 8 has a laminated structure of a polysilicon layer 40 and a metal layer 42. Metal-layer removal region 140 is not provided in gate line GLa1. In gate line GLa1, a part of metal layer 42 is connected to a not-shown word line via a contact 120a.

On the other hand, in gate line 8, metal-layer removal region 140 is provided between a region electrically coupled to storage node /NS via a contact 120b and a region right above the gate of load transistor PT2. In metal-layer removal region 140, a non-metal layer 145 is formed instead of metal layer 42. Non-metal layer 145 is formed from an insulator or a high-resistance material. For example, non-metal layer 145 may be formed from polysilicon. Although not shown in the figure, gate line 6 has the same structure as that of gate line 8.

With this structure, in each gate line 6, 8, a signal propagated from storage node NS, /NS via contact 120b is transmitted through the interface between metal layer 42 and polysilicon layer 40 to the gates of load transistor PT1, PT2 and drive transistor NT1, NT2. This structure further increases the electric resistance of the propagation path of the electric signal from storage node NS, /NS as compared to the first embodiment, thereby enabling further reduction in propagation speed of the electric signal. This allows the SRAM memory cell of the third embodiment to have improved soft-error resistance over the SRAM memory cell of the first embodiment without increasing the memory cell area and complicating the memory cell structure.

Modification of Third Embodiment

Referring to FIG. 10, in the modification of the third embodiment, metal-layer removal region 140 in gate line 8 is expanded as compared to metal-layer removal region 140 in FIG. 9. More specifically, in order to increase the electric resistance of gate line 8 and thus further improve soft-error resistance, metal layer 42 is formed only in a region for ensuring contact with storage node /NS, that is, in a region electrically coupled to contact 120b. In other words, the poly-metal structure is applied only to a region right below contact 120b. Although not shown in the figure, gate line 6 has the same structure as that of gate line 8.

This structure allows gate lines 6, 8 to have a further increased electric resistance in the propagation path of the electric signal from storage node NS, /NS as compared to the third embodiment, thereby enabling further improvement in soft-error resistance.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device, comprising:
a plurality of memory cells for storing data, wherein each memory cell includes
a first inverter section including first and second transistors, said first and second transistors being respectively connected between first and second voltages and a first storage node and having opposite conductivity types,
a second inverter section including third and fourth transistors, said third and fourth transistors being respectively connected between said first and second voltages and a second storage node and having opposite conductivity types,
a fifth transistor for connecting a first signal line to said first storage node,
a sixth transistor for connecting a second signal line complementary to said first signal line to said second storage node,
a first gate line having a laminated structure of a first metal layer and a first polysilicon layer, for electrically coupling gates of said first and second transistors to said second storage node through a contact resistance between said first metal layer and said first polysilicon layer, and
a second gate line having a laminated structure of a second metal layer and a second polysilicon layer, for electrically coupling gates of said third and fourth transistors to said first storage node through a contact resistance between said second metal layer and said second polysilicon layer.

2. The semiconductor memory device according to claim 1, wherein
said first and third transistors are formed in a well region of a first conductivity type and have a second conductivity type that is opposite to said first conductivity type,
said second, fourth, fifth and sixth transistors are formed in a well region of said second conductivity type and have said first conductivity type,
said first and second gate lines and gate electrodes of said fifth and sixth transistors extend in a same direction, and
diffusion layer regions of said first to sixth transistors extend in a direction along a boundary between the well regions of said first and second conductivity types.

3. The semiconductor memory device according to claim 1, wherein
said first gate line has a first non-metal layer formed on said first polysilicon layer between a contact region with said second storage node and a region right above said gates of said first and second transistors, and
said second gate line has a second non-metal layer formed on said second polysilicon layer between a contact region with said first storage node and a region right above said gates of said third and fourth transistors.

4. The semiconductor memory device according to claim 3, wherein in said first and second gate lines, said first and second non-metal layers are respectively formed on a whole surface of said first and second polysilicon layers except the contact regions.

5. A semiconductor memory device, comprising:
a plurality of memory cells for storing data, wherein each memory cell includes
a first inverter section including first and second transistors, said first and second transistors being respectively connected between first and second voltages and a first storage node and having opposite conductivity types,
a second inverter section including third and fourth transistors, said third and fourth transistors being respectively connected between said first and second voltages and a second storage node and having opposite conductivity types,
a fifth transistor for connecting a first signal line to said first storage node,
a sixth transistor for connecting a second signal line complementary to said first signal line to said second storage node,
a first gate line formed from a first silicon layer and a first metal film formed on said first silicon layer, and electrically coupled to said second storage node, said first silicon layer being coupled to gates of said first and second transistors, and
a second gate line formed from a second silicon layer and a second metal film formed on said second silicon layer, and electrically coupled to said first storage node, said second silicon layer being coupled to gates of said third and fourth transistors,
said first gate line has a non-metal film region, a region where said first metal film is not formed, in a part of a region between said second storage node and said first transistor, and
said second gate line has a non-metal film region, a region where said second metal film is not formed, in a part of a region between said first storage node and said third transistor.

6. The semiconductor memory device according to claim 5, wherein in each of said first and second gate lines, said non-metal film region is provided in said first and second metal layers between a contact region to said first and second storage nodes and a region right above said gates of said first to fourth transistors.

7. The semiconductor memory device according to claim 6, wherein
- said first and third transistors are formed in a well region of a first conductivity type and have a second conductivity type that is opposite to said first conductivity type,
- said second, fourth, fifth and sixth transistors are formed in a well region of said second conductivity type and have said first conductivity type,
- said first and second gate lines and gate electrodes of said fifth and sixth transistors extend in a same direction,
- diffusion layer regions of said first to sixth transistors extend in a direction along a boundary between the well regions of said first and second conductivity types, and
- said non-metal film region is formed between said diffusion layer regions of said first and third transistors.

8. The semiconductor memory device according to claim 7, wherein in each memory cell, said non-metal film region has a rectangular shape and extends to an adjacent memory cell in a direction along said boundary.

9. The semiconductor memory device according to claim 5, wherein in each of said first and second gate lines, said non-metal film region is provided in said first and second metal layers between regions right above said gates of said first and second transistors and between regions right above said gates of said third and fourth transistors in a plane direction.

10. The semiconductor memory device according to claim 9, wherein
- said first and third transistors are formed in a well region of a first conductivity type and have a second conductivity type that is opposite to said first conductivity type,
- said second, fourth, fifth and sixth transistors are formed in a well region of said second conductivity type and have said first conductivity type,
- diffusion layer regions of said first to fourth transistors extend in a direction along a boundary between the well regions of said first and second conductivity types,
- diffusion layer regions of said fifth and sixth transistors extend in a direction that crosses said boundary, and
- said non-metal film region is formed between said diffusion layer regions of said first and third transistors and said boundary in a plane direction.

11. The semiconductor memory device according to claim 10, wherein in each memory cell, said non-metal film region has a rectangular shape and extends to an adjacent memory cell in a direction along said boundary.

* * * * *